US012704238B2

(12) United States Patent
Kiyota et al.

(10) Patent No.: US 12,704,238 B2
(45) Date of Patent: Aug. 11, 2026

(54) LIGHT-EMITTING DEVICE

(71) Applicant: NICHIA CORPORATION, Anan (JP)

(72) Inventors: Seiji Kiyota, Itano-gun (JP); Kazuma Kozuru, Anan (JP); Eiichiro Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 19/202,081

(22) Filed: May 8, 2025

(65) Prior Publication Data

US 2025/0264205 A1 Aug. 21, 2025

Related U.S. Application Data

(63) Continuation of application No. 18/394,233, filed on Dec. 22, 2023, now Pat. No. 12,320,516, which is a (Continued)

(30) Foreign Application Priority Data

May 20, 2015 (JP) ................................ 2015-103264
Mar. 15, 2016 (JP) ................................ 2016-051530

(51) Int. Cl.
*F21V 5/00* (2018.01)
*F21V 5/04* (2006.01)
(Continued)

(52) U.S. Cl.
CPC ................ *F21V 5/007* (2013.01); *F21V 5/04* (2013.01); *F21V 7/0083* (2013.01); (Continued)

(58) Field of Classification Search
CPC ..... F21V 5/007; F21V 7/0083; G02B 3/0056; G02B 19/0057
See application file for complete search history.

(56) References Cited

U.S. PATENT DOCUMENTS 5,139,609 A 8/1992 Fields et al.
5,477,372 A 12/1995 Ota
(Continued)

FOREIGN PATENT DOCUMENTS

CN 1212060 A 3/1999
CN 101971378 A 2/2011
(Continued)

OTHER PUBLICATIONS

Extended European Search Report issued in European Patent Application No. 16170351.7 mailed Oct. 25, 2016.
(Continued)

*Primary Examiner* — William N Harris
(74) *Attorney, Agent, or Firm* — Foley & Lardner LLP

(57) ABSTRACT

A light-emitting device includes: a base having an upper surface; one or more semiconductor laser elements disposed on the upper surface and configured to emit light in a first direction in a top view; one or more reflecting members spaced from the one or more semiconductor laser elements in the first direction in a top view; and a lens member having one or more lens sections through which light reflected by the one or more reflecting members passes, the lens member being fixed to the base and positioned above the one or more semiconductor laser elements and the one or more reflecting members. In a top view, at least a portion of a first of the one or more reflecting members and an emitting surface of a first of the one or more semiconductor laser elements is disposed in a region inward of an outer edge of a first of the one or more lens sections.

15 Claims, 24 Drawing Sheets

Related U.S. Application Data continuation of application No. 18/298,784, filed on Apr. 11, 2023, now Pat. No. 11,892,155, which is a continuation of application No. 17/864,018, filed on Jul. 13, 2022, now Pat. No. 11,655,958, which is a continuation of application No. 17/185,640, filed on Feb. 25, 2021, now Pat. No. 11,428,382, which is a continuation of application No. 16/297,415, filed on Mar. 8, 2019, now Pat. No. 11,149,917, which is a continuation of application No. 15/157,897, filed on May 18, 2016, now Pat. No. 10,267,483.

(51) Int. Cl.

| | |
|---|---|
| ***F21V 7/00*** | (2006.01) |
| ***G02B 3/00*** | (2006.01) |
| ***G02B 19/00*** | (2006.01) |
| ***H01S 5/00*** | (2006.01) |
| ***H01S 5/02216*** | (2021.01) |
| ***H01S 5/02253*** | (2021.01) |
| ***H01S 5/02255*** | (2021.01) |
| ***H01S 5/02345*** | (2021.01) |
| ***H01S 5/40*** | (2006.01) |

(52) U.S. Cl.

CPC ....... *G02B 3/0056* (2013.01); *G02B 19/0057* (2013.01); *H01S 5/0071* (2013.01); *H01S 5/02216* (2013.01); *H01S 5/02253* (2021.01); *H01S 5/02255* (2021.01); *H01S 5/4018* (2013.01); *H01S 5/4025* (2013.01); *H01S 5/405* (2013.01); *H01S 5/02345* (2021.01)

(56) References Cited

U.S. PATENT DOCUMENTS 6,109,751 A 8/2000 Hashizume et al.
6,554,451 B1 4/2003 Keuper
8,097,221 B2 1/2012 Incorvia et al.
8,957,601 B2 2/2015 Tikkanen et al.
9,018,747 B2 4/2015 Nagata
9,377,175 B2* 6/2016 Kuo ...................... F21V 17/101
9,509,116 B2 11/2016 Breidenassel et al.
2003/0043582 A1 3/2003 Chan et al.
2004/0247011 A1 12/2004 Okazaki et al.
2005/0226636 A1 10/2005 Hiramatsu et al.
2005/0265655 A1 12/2005 Okazaki et al.
2006/0268548 A1 11/2006 Chang
2007/0091945 A1 4/2007 Ferstl
2007/0098334 A1 5/2007 Chen
2007/0262337 A1 11/2007 Villard
2008/0084905 A1 4/2008 Doerfel et al.
2009/0267085 A1 10/2009 Lee et al.
2010/0195323 A1* 8/2010 Schaefer ............... F21V 7/0083 362/235
2010/0213471 A1 8/2010 Fukasawa et al.
2010/0224904 A1 9/2010 Lee et al.
2010/0259706 A1 10/2010 Kuwaharada et al.
2010/0271818 A1* 10/2010 Smith ................... F21V 7/0083 362/235
2011/0063836 A1 3/2011 Salm
2011/0068354 A1 3/2011 Tran et al.
2011/0140135 A1 6/2011 Lee et al.
2011/0175128 A1 7/2011 Lee et al.
2011/0241054 A1 10/2011 Lee et al.
2011/0280014 A1 11/2011 Householder et al.
2011/0292658 A1 12/2011 Ho
2012/0056215 A1 3/2012 Lee et al.
2012/0097996 A1 4/2012 Lee et al.
2012/0230033 A1 9/2012 Yoon et al.
2012/0320585 A1 12/2012 Lin et al.
2013/0147347 A1 6/2013 Laporte
2013/0170174 A1 7/2013 Chou et al.
2013/0235581 A1 9/2013 Iatan
2013/0265770 A1 10/2013 Breidenassel et al.
2013/0272329 A1 10/2013 Auen et al.
2013/0299843 A1 11/2013 Motoda
2013/0301013 A1 11/2013 Samejima et al.
2013/0301264 A1 11/2013 Van Gompel
2013/0329397 A1 12/2013 Shimizu et al.
2014/0063802 A1 3/2014 Garcia
2014/0139810 A1 5/2014 Matsubara
2014/0197528 A1 7/2014 Nagata
2014/0299897 A1* 10/2014 Zhang .................. F21V 7/0083 257/88
2014/0374770 A1 12/2014 Motoda
2015/0009669 A1 1/2015 Gervais et al.
2015/0055667 A1 2/2015 Horn et al.
2015/0129904 A1 5/2015 Lee et al.
2015/0138766 A1 5/2015 Kuo
2015/0204491 A1 7/2015 Yuan et al.
2016/0087399 A1 3/2016 Horn et al.
2016/0126704 A1 5/2016 Horn et al.
2016/0215955 A1 7/2016 Donato et al.
2016/0240740 A1 8/2016 Lee et al.
2016/0245490 A1 8/2016 Jurik et al.
2016/0327235 A1 11/2016 Khrushchev
2017/0114993 A1 4/2017 Kim et al.
2018/0017235 A1 1/2018 Casper et al.
2018/0187862 A1 7/2018 Donato et al.
2018/0253999 A1 9/2018 Auyeung et al.
2019/0123509 A1 4/2019 Hashimoto et al.

FOREIGN PATENT DOCUMENTS

CN 102053418 A 5/2011
CN 103389614 A 11/2013
DE 10 2004 051 362 A1 4/2006
EP 1 830 443 A1 9/2007
JP S63-081992 A 4/1988
JP H06-230203 A 8/1994
JP H06-252278 A 9/1994
JP H07-174997 A 7/1995
JP H08-286016 A 11/1996
JP H10-256648 A 9/1998
JP H10-335747 A 12/1998
JP 2001-256661 A 9/2001
JP 2003-344609 A 12/2003
JP 2007-019301 A 1/2007
JP 2007-027471 A 2/2007
JP 2007-027716 A 2/2007
JP 2007-065463 A 3/2007
JP 2007-250817 A 9/2007
JP 2007-266484 A 10/2007
JP 2007-305736 A 11/2007
JP 2007-335678 A 12/2007
JP 2008-015036 A 1/2008
JP 2009-080978 A 4/2009
JP 2009-086615 A 4/2009
JP 2010-045274 A 2/2010
JP 2010-199204 A 9/2010
JP 2011-049338 A 3/2011
JP 2011-066462 A 3/2011
JP 2012-049303 A 3/2012
JP 2012-094728 A 5/2012
JP 2013-178438 A 9/2013
JP 2013-236010 A 11/2013
JP 2013-238635 A 11/2013
JP 2014-102367 A 6/2014
WO WO-03/077389 A1 9/2003
WO WO-2011/142059 A1 11/2011
WO WO-2013/027669 A1 2/2013
WO WO-2014/180682 A 11/2014
WO WO-2014/191419 A1 12/2014

OTHER PUBLICATIONS

Final Office Action in U.S. Appl. No. 15/157,897 dated Jul. 30, 2018.
Final Office Action in U.S. Appl. No. 16/297,415 dated Dec. 1, 2020.

(56) References Cited

OTHER PUBLICATIONS

Final Office Action in U.S. Appl. No. 18/394,233 dated Nov. 12, 2024.
Non-Final Office Action in U.S. Appl. No. 15/157,897 dated Jan. 8, 2018.
Non-Final Office Action in U.S. Appl. No. 16/297,415 dated Mar. 9, 2021.
Non-Final Office Action in U.S. Appl. No. 16/297,415 dated Jun. 10, 2020.
Non-Final Office Action in U.S. Appl. No. 17/185,640 dated Dec. 21, 2021.
Non-Final Office Action in U.S. Appl. No. 17/864,018 dated Sep. 8, 2022.
Non-Final Office Action in U.S. Appl. No. 18/394,233 dated Jun. 12, 2024.

* cited by examiner

LIGHT-EMITTING DEVICE

CROSS-REFERENCE TO RELATED APPLICATIONS

The present application is a continuation of U.S. patent application Ser. No. 18/394,233, filed on Dec. 22, 2023, which is a continuation of U.S. patent application Ser. No. 18/298,784, filed on Apr. 11, 2023 (now U.S. Pat. No. 11,892,155), which is a continuation of U.S. patent application Ser. No. 17/864,018, filed on Jul. 13, 2022 (now U.S. Pat. No. 11,655,958), which is a continuation of U.S. patent application Ser. No. 17/185,640, filed on Feb. 25, 2021 (now U.S. Pat. No. 11,428,382), which is a continuation of U.S. patent application Ser. No. 16/297,415, filed on Mar. 8, 2019 (now U.S. Pat. No. 11,149,917), which is a continuation of U.S. patent application Ser. No. 15/157,897, filed on May 18, 2016 (now U.S. Pat. No. 10,267,483), which claims priority to Japanese Patent Application No. 2015-103264, filed on May 20, 2015, and Japanese Patent Application No. 2016-051530, filed on Mar. 15, 2016. The entire disclosures of these applications are incorporated herein by reference.

BACKGROUND

The present disclosure relates to a light-emitting device.

A light source device that collimates light emitted from a plurality of light sources with a collimator lens array is known (Japanese Patent Application Laid-open No. 2014-102367).

However, in the conventional light source device described above, respective lens elements constituting the collimator lens array have a plurality of curvatures in accordance with sectional shapes of laser beams incident to the respective lens elements. Therefore, when the collimator lens array is mounted even only slightly rotated from a prescribed direction, there is a risk that a significant deviation may occur in a positional relationship between the light sources and the lens elements and, consequently, an intensity distribution of light emitted from the collimator lens array may change.

SUMMARY

The problem described above can be solved by certain embodiments of the present invention. In one embodiment, a light-emitting device includes: a substrate; a lens array having a plurality of lens sections in a matrix pattern; and a plurality of semiconductor laser elements arranged on the substrate, wherein the plurality of semiconductor laser elements respectively emit a laser beam, each laser beam has a beam shape with a greater width in a column direction than in a row direction on a light incident surface of each of the plurality of lens sections, and the plurality of lens sections have an inter-vertex distance in the row direction that is smaller than both a maximum outer diameter of each of the lens sections and an inter-vertex distance in the column direction and have a same curvature in the row direction and the column direction.

According to the light-emitting device described above, a light-emitting device can be provided in which, even when the lens array is mounted slightly rotated from a prescribed direction, a significant deviation is less likely to occur in a positional relationship between a light sources and a lens element and intensity distribution of light emitted from the lens array is less susceptible to change.

DETAILED DESCRIPTION

Light-Emitting Device According to First Embodiment

Figure 1A:
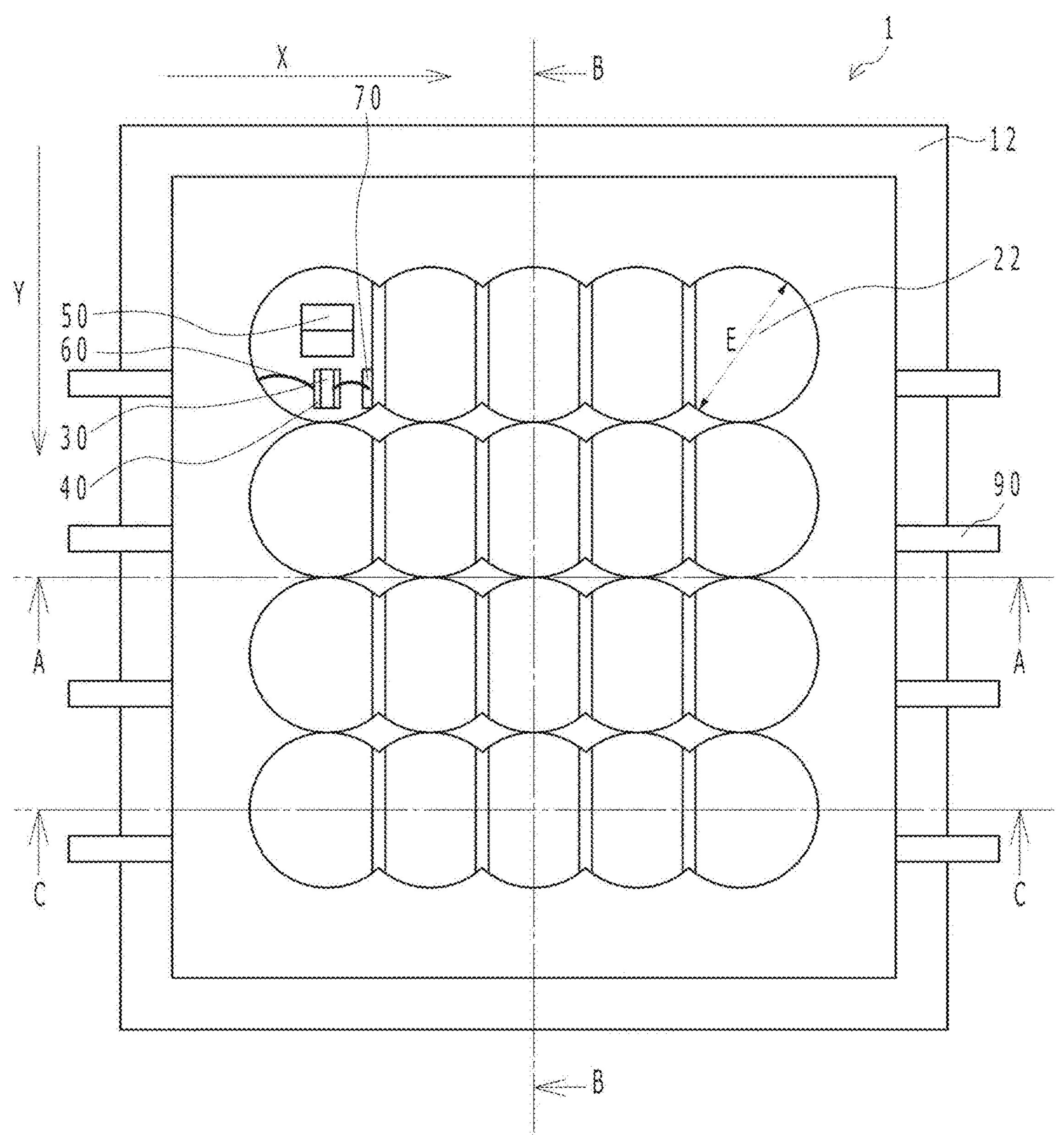
FIG. 1A is a schematic plan view of a light-emitting device according to a first embodiment.
Figure 1B:
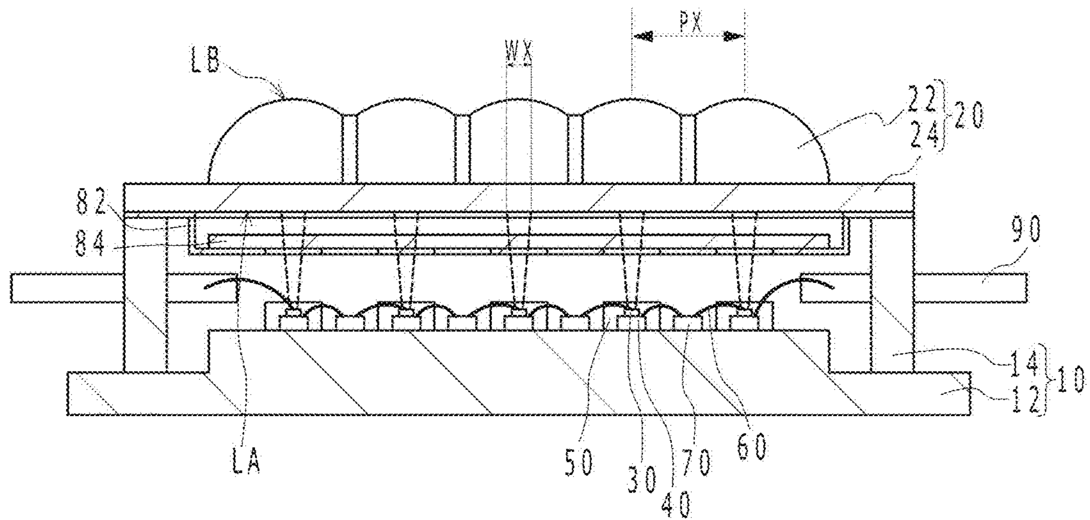
FIG. 1B is a sectional view taken along A-A in FIG. 1A.
Figure 1C:
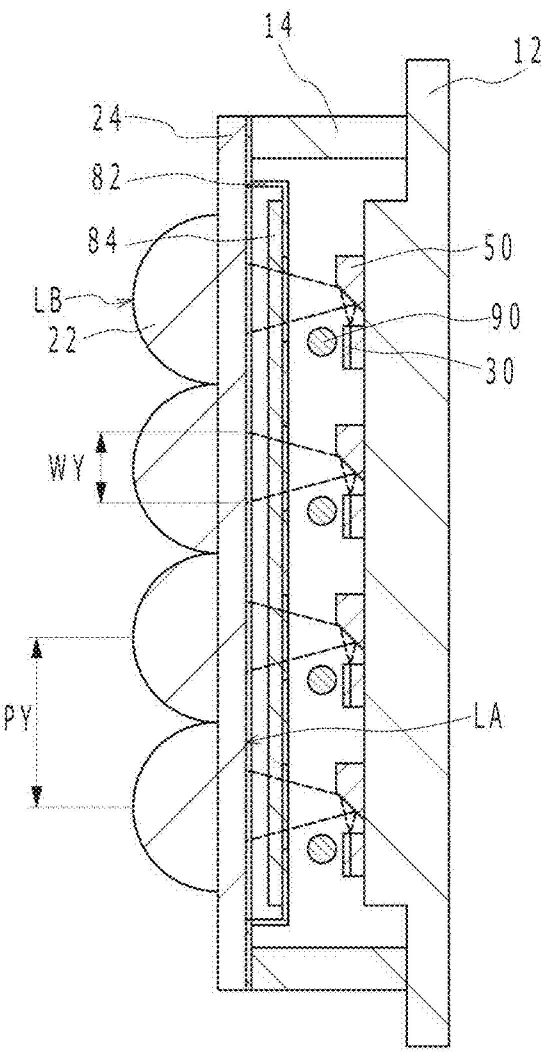
FIG. 1C is a sectional view taken along B-B in FIG. 1A.
Figure 1D:
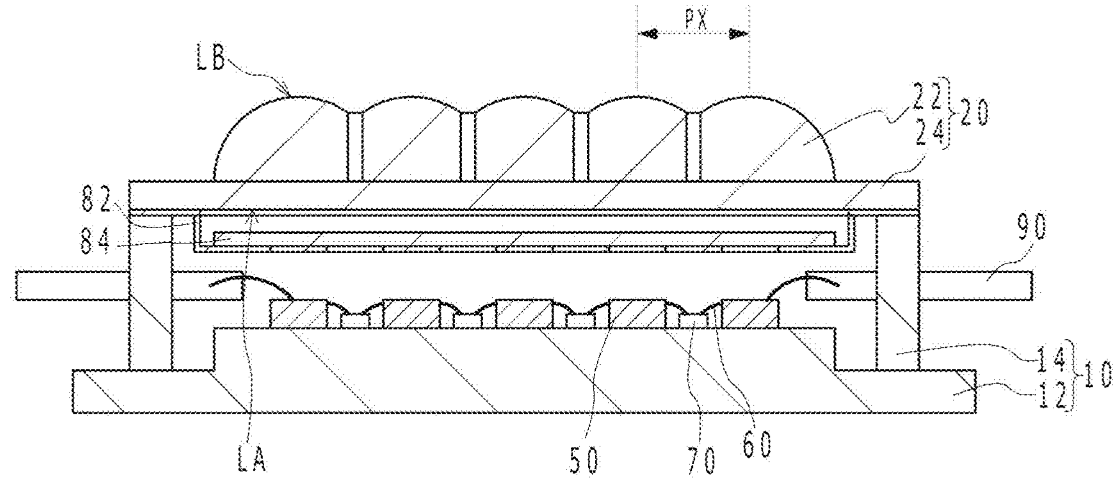
FIG. 1D is a sectional view taken along C-C in FIG. 1A.

FIG. 1A is a schematic plan view of a light-emitting device according to a first embodiment. In addition, FIG. 1B is a sectional view taken along A-A in FIG. 1A, FIG. 1C is a sectional view taken along B-B in FIG. 1A, and FIG. 1D is a sectional view taken along C-C in FIG. 1A. In FIG. 1A, a semiconductor laser element 30 and the like that are arranged below a top left lens section are transparently shown in order to facilitate understanding. As shown in FIGS. 1A to 1D, a light-emitting device 1 according to the first embodiment is an light-emitting device including: a substrate 10; a lens array 20 having a plurality of lens sections 22 in a matrix pattern; and a plurality of semiconductor laser elements 30 arranged on the substrate 10, wherein the plurality of semiconductor laser elements 30 respectively emit a laser beam, each laser beam has a beam shape with a greater width in a column direction than in a row direction on a light incident surface LA of each of the plurality of lens sections 22, and the plurality of lens sections 22 have an inter-vertex distance PX in the row direction that is smaller than both a maximum outer diameter E of each of the lens sections 22 and an inter-vertex distance PY in the column direction and has a same curvature in the row direction and the column direction. An orderly description will be given below.

Substrate 10

Figure 2A:
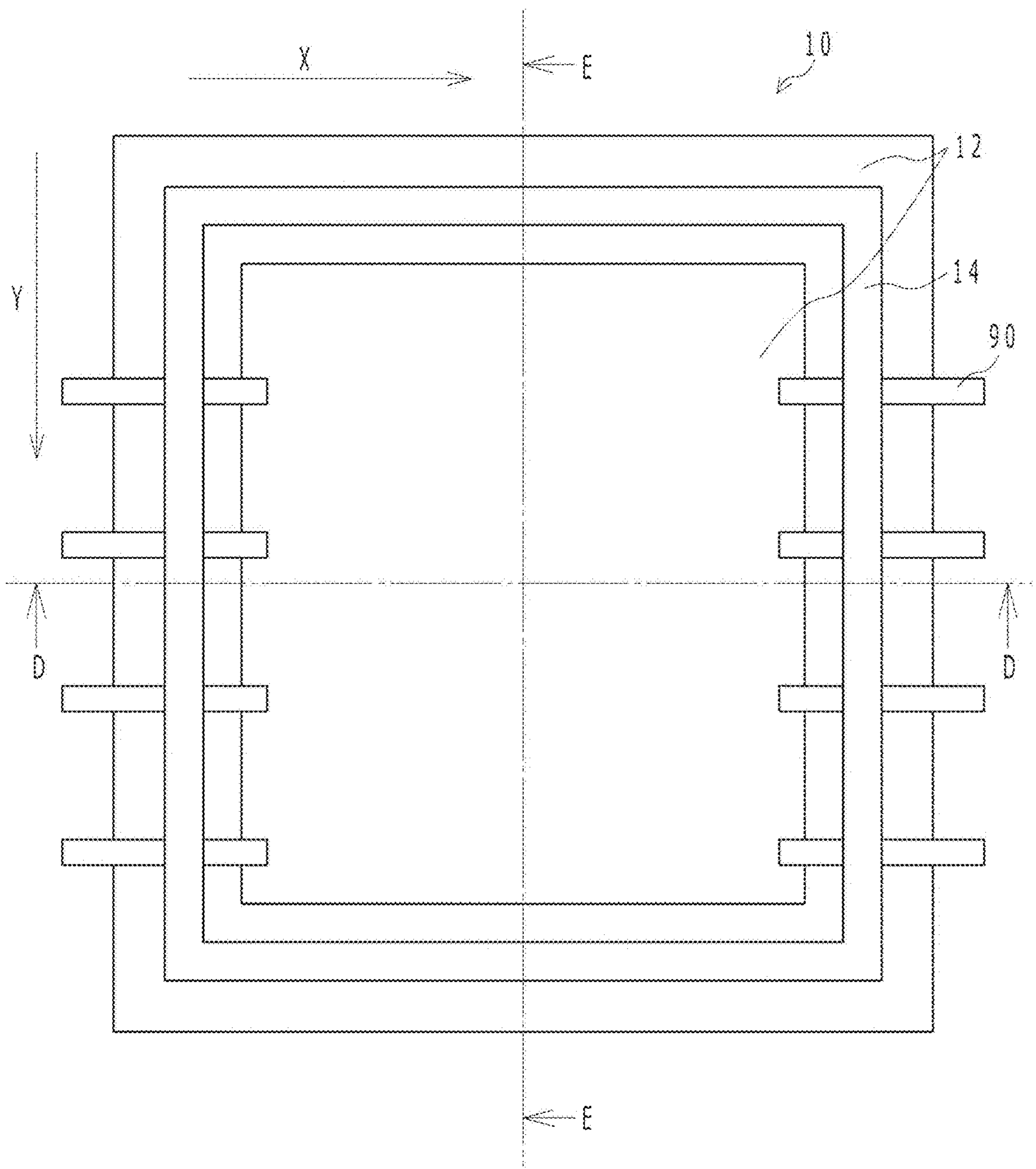
FIG. 2A is a schematic plan view of a substrate.
Figure 2B:
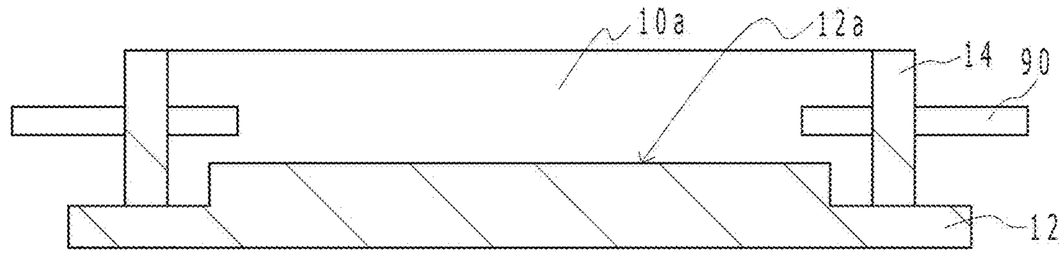
FIG. 2B is a sectional view taken along D-D in FIG. 2A.
Figure 2C:
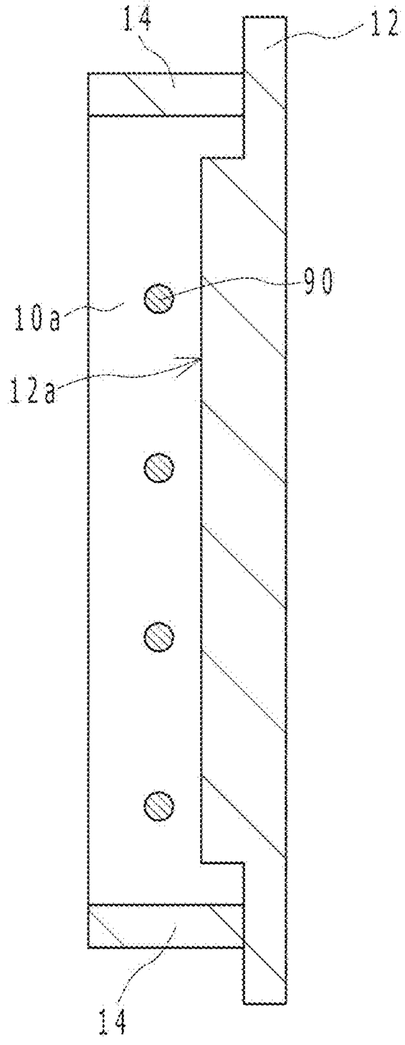
FIG. 2C is a sectional view taken along E-E in FIG. 2A.

FIG. 2A is a schematic plan view of a substrate. FIG. 2B is a sectional view taken along D-D in FIG. 2A. FIG. 2C is a sectional view taken along E-E in FIG. 2A. As shown in FIGS. 2A to 2C, for example, the substrate 10 includes a base 12, a side wall 14 that protrudes from the base 12, and a recess 10*a* formed by the base 12 and the side wall 14.

The base 12 has a protrusion 12*a* and the protrusion 12*a* is formed inside of the recess 10*a*. Since the use of the base 12 having the protrusion 12*a* described above enables warpage of the base 12 (this warpage is particularly likely to occur when the base 12 and the side wall 14 are made of different materials), which may occur due to the substrate 10 having the recess 10*a* to be suppressed, the semiconductor laser elements 30 and the like can be easily mounted to the base 12. In addition, since arranging members such as the semiconductor laser elements 30 on the protrusion 12*a* enables the members to be brought closer to the lens array 20, diffusion of laser beams on the light incident surfaces LA of the lens array 20 (the lens sections 22) can also be suppressed. Shapes and thicknesses of the substrate 10, the base 12, and the side wall 14 are not particularly limited and, for example, in addition to a member having the recess 10*a*, a flat plate-like member (for example, a member without the side wall 14 and solely constituted by the base 12) can also be used as the substrate 10.

For example, a metal material such as iron, iron alloy, and copper, a ceramic material such as AlN, SiC, and SiN, or a material combining these materials can be used as the substrate 10 (the base 12 and the side wall 14).

The substrate 10 is provided with wirings 90 (for example, leads) for electrically connecting the light-emitting device 1 to the outside. While the wirings 90 may be provided anywhere on an outer edge of the light-emitting device 1, the wirings 90 are preferably provided on an upper surface or a side surface of the substrate 10. In other words, the wirings 90 are preferably not provided on a lower surface of the substrate 10. Accordingly, since an entire lower surface of the substrate 10 can be used as a mounting surface, even in a case where a plurality of semiconductor laser elements 30 that are heat sources are arranged on one substrate 10 as in the present disclosure, a light-emitting device with satisfactory heat dissipation can be provided. When providing the wirings 90 on the side wall 14 of the substrate 10, since a height of the side wall 14 must be at a certain height or higher, the semiconductor laser elements 30 and the like arranged on the base 12 are to be arranged further away from the lens array 20 as compared to a case where the wirings 90 are not provided on the side wall 14. However, even in such a case, the use of the base 12 having the protrusion 12*a* described above enables the semiconductor laser elements 30, a mirror 50, and the like to be arranged closer to the lens array 20 (the lens sections 22).

Lens Array 20

Figure 3A:
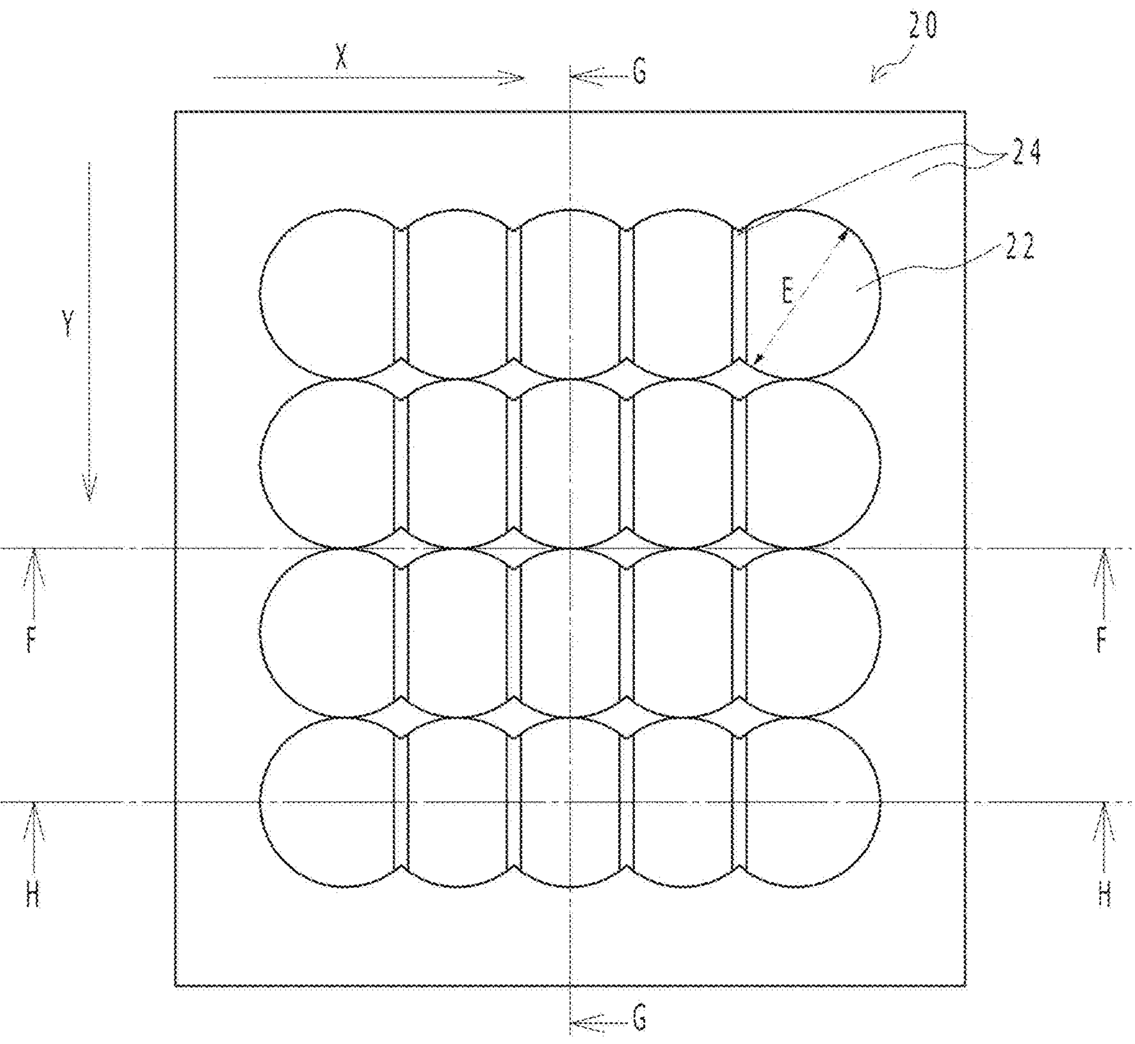
FIG. 3A is a schematic plan view of a lens array.
Figure 3B:
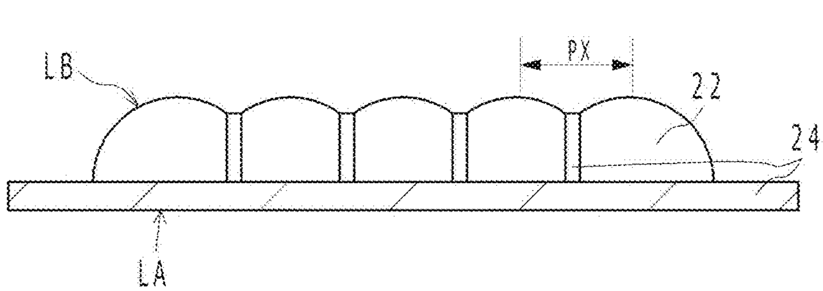
FIG. 3B is a sectional view taken along F-F in FIG. 3A.
Figure 3C:
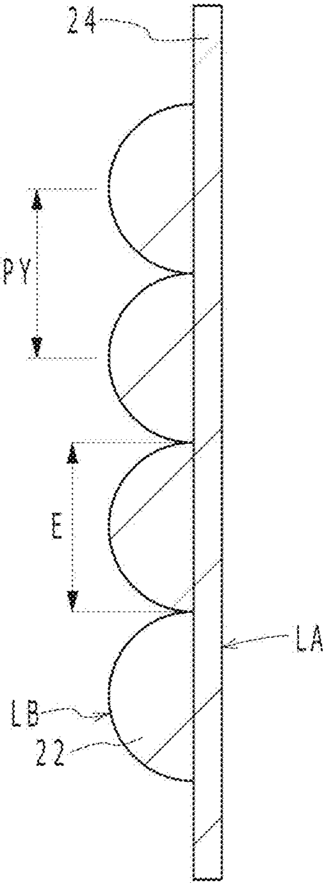
FIG. 3C is a sectional view taken along G-G in FIG. 3A.
Figure 3D:
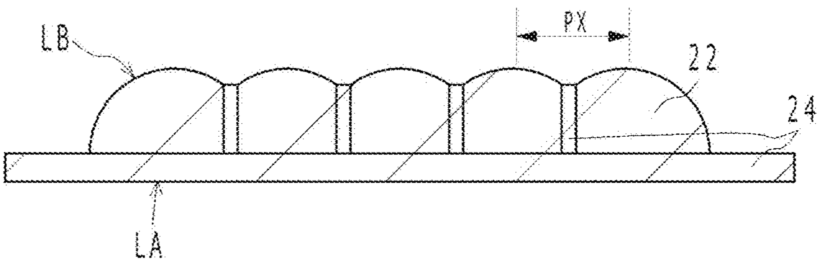
FIG. 3D is a sectional view taken along H-H in FIG. 3A.

FIG. 3A is a schematic plan view of a lens array. FIG. 3B is a sectional view taken along F-F in FIG. 3A. FIG. 3C is a sectional view taken along G-G in FIG. 3A. FIG. 3D is a sectional view taken along H-H in FIG. 3A. As shown in FIGS. 3A to 3D, the lens array 20 has a plurality of lens sections 22 and a connecting section 24. Each lens section 22 has a light incident surface LA and a light-emitting surface LB, and each laser beam incident to the light incident surface LA of each lens section 22 is refracted and emitted from the light-emitting surface LB of each lens section 22. The connecting section 24 connects lens sections 22 adjacent to each other in a column direction (a Y direction in FIG. 3A). Alternatively, the lens array 20 can be solely constituted by the lens sections 22. In this case, for example, the lens sections 22 are directly connected to each other without involving the connecting section 24. The lens array 20 (the lens sections 22 and the connecting section 24) can be formed using a transmissive material such as glass or synthetic quartz.

Plurality of Lens Sections 22

The plurality of lens sections 22 are provided in an m-row, n-column ($m \geq 2$, $n \geq 1$) matrix pattern. The plurality of lens sections 22 have an inter-vertex distance PX in the row direction (an X direction in FIG. 3A) that is smaller than both a maximum outer diameter E of each of the lens sections 22 and an inter-vertex distance PY in the column direction (the Y direction in FIG. 3A). Accordingly, since the respective lens sections 22 are consecutively formed in the row direction (the X direction in FIG. 3A), a waste in space where a laser beam is not emitted in the row direction (the X direction in FIG. 3A) can be reduced and downsizing of the lens array 20 (and, by extension, downsizing of the light-emitting device 1) can be achieved. An "inter-vertex distance in the column direction" refers to an inter-vertex distance between adjacent lens sections in the column direction. In addition, an "inter-vertex distance in the row direction" refers to an inter-vertex distance between adjacent lens sections in the row direction. A "vertex" refers to a center of a lens section in a plan view and a "maximum outer diameter" refers to a maximum diameter among diameters of the lens section in a plan view.

The inter-vertex distance PY in the column direction (the Y direction in FIG. 3A) can be set preferably in a range of 1 mm or more and 12 mm or less, and more preferably in a range of 3 mm or more and 9 mm or less. The inter-vertex distance PX in the row direction (the X direction in FIG. 3A) can be set preferably in a range of 0.5 mm or more and 9 mm or less, and more preferably in a range of 2 mm or more and 6 mm or less. By setting the inter-vertex distance PX and the inter-vertex distance PY to these lower limit values or more, mutual interference between laser beams from adjacent semiconductor laser elements 30 can be suppressed. By setting the inter-vertex distance PX and the inter-vertex distance PY to these upper limit values or less, a smaller light-emitting device can be provided.

The maximum outer diameter E of each lens sections 22 can be set preferably in a range of 1 time or more and 2 times or less, and more preferably in a range of 1.25 times or more and 1.75 times or less of the inter-vertex distance PX. By setting the maximum outer diameter E to these lower limit values or more, mutual interference between laser beams from adjacent semiconductor laser elements 30 can be suppressed. By setting the maximum outer diameter E to these upper limit values or less, a smaller light-emitting device can be provided.

Each of the lens sections 22 has a same curvature in the row direction (the X direction in FIG. 3A) and in the column direction (the Y direction in FIG. 3A). In other words, each of the lens sections 22 has a curved line with a curvature RX in a cross section in the row direction (the X direction in FIG. 3A) that passes through the vertex of the lens section 22 and a curved line with a curvature RY that is equal to the curvature RX (curvature RX=curvature RY) in a cross section in the column direction (the Y direction in FIG. 3A) that passes through the vertex of the lens section 22. Accordingly, even when the lens array 20 is mounted slightly rotated from a prescribed direction, a significant deviation is less likely to occur in a positional relationship between a light source (the semiconductor laser element 30 or, when the mirror 50 is provided, the mirror 50: hereinafter, the same description will apply) and the lens section 22. Preferably, each of the lens sections 22 has a same curvature not only in the row direction (the X direction in FIG. 3A) and in the column direction (the Y direction in FIG. 3A) but in all directions passing through the vertex of each lens section 22. In other words, each of the lens sections 22 has curved lines with a same curvature in all cross section that pass through the vertex of each lens section 22. Accordingly, a significant deviation is more unlikely to occur in a positional relationship between the light source and the lens section 22.

While not particularly limited, each of the plurality of lens sections 22 preferably has a shape capable of parallelizing (collimating) laser beam incident from each of the semiconductor laser elements 30. For example, preferably, at least a part of each of the plurality of lens sections 22 has an aspherical curved surface (for example, the light incident surface LA is a flat surface and the light-emitting surface LB is an aspherical curved surface). Accordingly, laser beams from the semiconductor laser elements 30 can be parallelized without changing light intensity distribution.

Preferably, at least a part of outer edge of each of the plurality of lens sections 22 has an arc shape in a plan view. Accordingly, compared to a case where the outer edge of each of the plurality of lens sections 22 is constituted by other shapes in a plan view, since a larger number of aspherical curved surfaces can be provided in the lens sections 22, laser beams from the semiconductor laser elements 30 can be emitted from the lens sections 22 in an efficient manner.

The lens array 20 can be fixed to the substrate 10 (when a sealing member 80 is provided between the substrate 10 and the lens array 20, the sealing member 80) by known methods. For example, when directly fixing the lens array 20 to the substrate 10, the lens array 20 and the substrate 10 can be fixed to each other by methods such as adhesion fixing, laser welding, resistance welding, or the like. When the lens array 20 is fixed by laser welding, resistance welding or the like, at least a part of the lens array 20 to be subjected to a welding process is constituted by a metal material. When the sealing member 80 is provided between the substrate 10 and the lens array 20, the lens array 20 and the sealing member 80 can be adhesively fixed to each other using an adhesive such as a UV curable adhesive.

In order to make a space in which the semiconductor laser elements 30 are arranged a sealed space, preferably, the substrate 10 and a member that covers the substrate 10 are fixed by welding. However, welding is likely to cause displacement. Therefore, when the lens array is directly fixed to the substrate by welding and the substrate is directly covered by the lens array, there is a risk that the lens array may become displaced and incapable of causing incidence of light from the semiconductor laser elements in a prescribed mode (for example, a prescribed beam divergence angle or a prescribed positional relationship). In consideration thereof, in the present embodiment, the sealing member 80 that is a separate member from the lens array 20 is provided and the substrate 10 is to be covered by the sealing member 80. Accordingly, the lens array 20 can be fixed to the sealing member 80 by a UV curable adhesive while fixing the sealing member 80 to the substrate 10 by welding. Thus, displacement of the lens array 20 can be suppressed while making a sealed space where the semiconductor laser elements 30 are arranged by the sealing member 80.

Plurality of Semiconductor Laser Elements 30

Figure 4A:
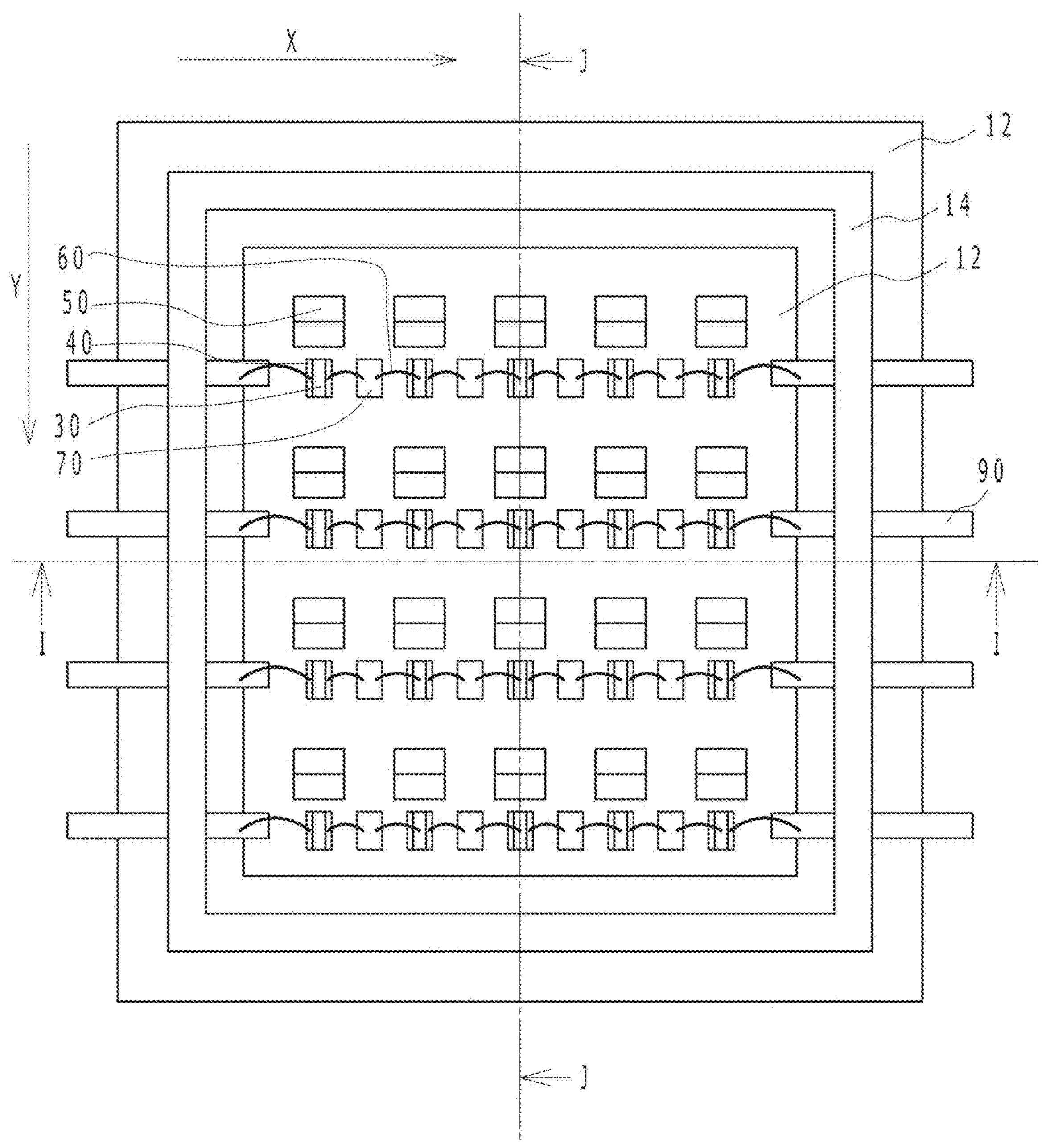
FIG. 4A is a schematic plan view of semiconductor laser elements arranged on a substrate.
Figure 4B:
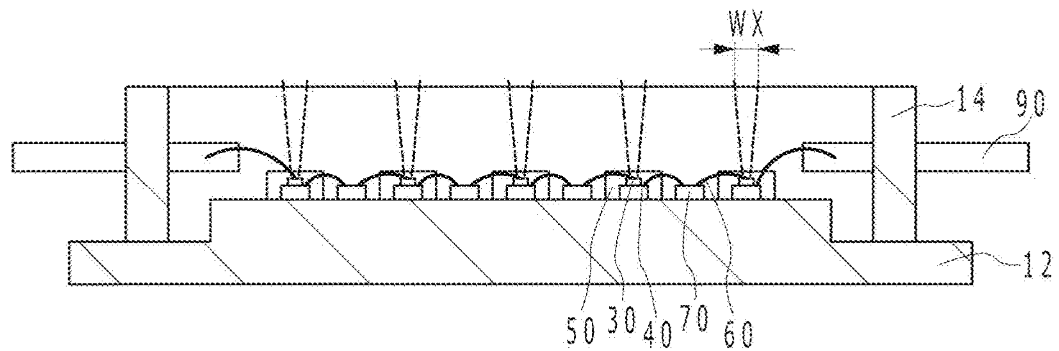
FIG. 4B is a sectional view taken along I-I in FIG. 4A.
Figure 4C:
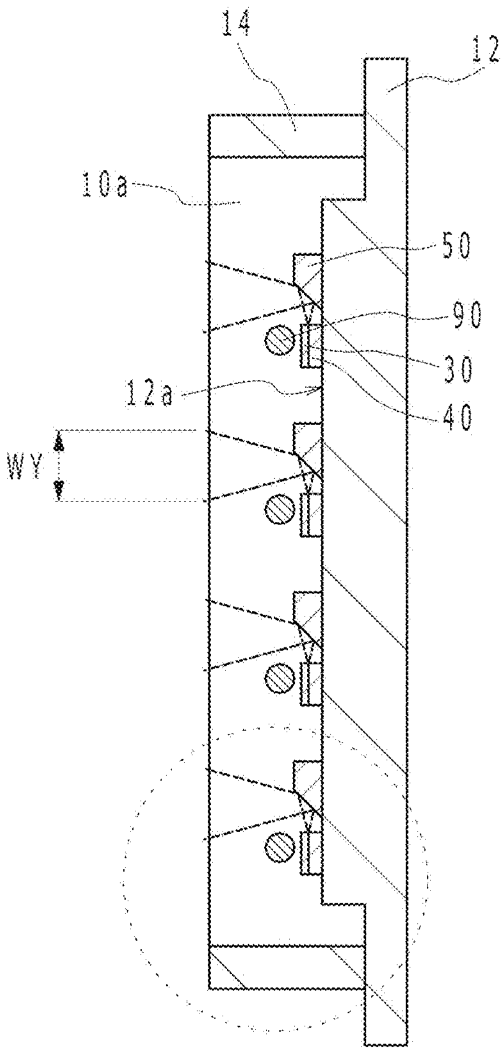
FIG. 4C is a sectional view taken along J-J in FIG. 4A.
Figure 4D:
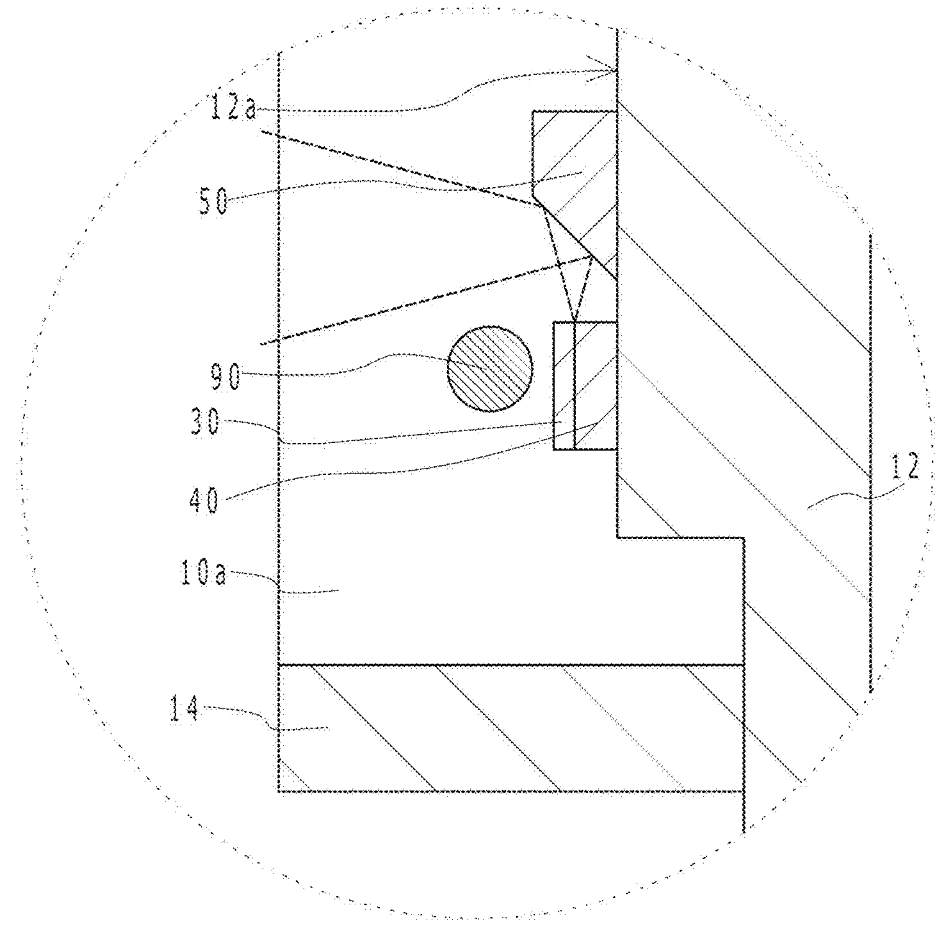
FIG. 4D is a diagram showing an enlargement of a portion enclosed by a dashed line in FIG. 4C.

FIG. 4A is a schematic plan view of semiconductor laser elements arranged on the substrate. FIG. 4B is a sectional view taken along I-I in FIG. 4A. FIG. 4C is a sectional view taken along J-J in FIG. 4A. FIG. 4D is a diagram showing an enlargement of a portion enclosed by a dashed line in FIG. 4C. As shown in FIGS. 4A to 4D, the plurality of semiconductor laser elements 30 are arranged on the substrate 10. Specifically, the plurality of semiconductor laser elements 30 are arranged in the row direction (the X direction in FIG. 4A) and in the column direction (the Y direction in FIG. 4A). For example, each of the semiconductor laser elements 30 can be directly arranged on a bottom surface of the recess 10*a* (when using the base 12 having the protrusion 12*a*, on the protrusion 12*a*) of the substrate 10 or can be arranged via a mounting body 40 or the like. By arranging each of the semiconductor laser elements 30 via the mounting body 40, heat generated by each of the semiconductor laser elements 30 can be efficiently dissipated via the mounting body 40.

The plurality of semiconductor laser elements 30 emit respective laser beams, and each laser beam is incident to the light incident surface LA of each lens section 22 either directly or reflected by the mirror 50 or the like. Each laser beam has a beam shape with a greater width in the column direction (the Y direction in FIG. 4A) than in the row direction (the X direction in FIG. 4A) on the light incident surface LA of each of the plurality of lens sections 22 (beam width in the column direction WY>beam width in the row direction WX). Semiconductor laser element using nitride semiconductor or the like can be used as the semiconductor laser element 30.

The plurality of semiconductor laser elements 30 can be electrically connected to each other by wires 60 or the like. As the wires 60, gold, silver, copper, aluminum, or the like can be used. While a mode of connection is not particularly limited, for example, the plurality of semiconductor laser elements 30 provided in the row direction (the X direction in FIG. 4A) can be serially connected to one another using the wires 60.

In FIG. 4A, the plurality of semiconductor laser elements 30 are arranged on a straight line in each row and a relay member 70 is provided between adjacent semiconductor laser elements 30. In addition, adjacent semiconductor laser elements 30 are electrically connected to each other by the wires 60 via the relay member 70. Accordingly, since a length of each wire 60 can be relatively shortened, an increase in electric resistance can be suppressed. Furthermore, since a distance between adjacent semiconductor laser elements 30 can be made long in each row, thermal interference between adjacent semiconductor laser elements 30 can be reduced. As the relay member 70, a metal material such as iron, iron alloy, or copper or an insulating material such as AlN, SiC, or SiN having electric wiring formed on an upper surface thereof can be used. The semiconductor laser element 30 is not arranged on the relay member 70.

Preferably, an upper surface of the relay member 70 is positioned at a substantially same height as an upper surface of the mounting body 40 or an upper surface of the semiconductor laser element 30. Accordingly, the wires 60 can be mounted more easily. When the semiconductor laser element 30 is provided on the mounting body 40, the upper surface of the relay member 70 is positioned at a substantially same height as the upper surface of the mounting body 40. Accordingly, compared to a case where the upper surface of the relay member 70 is positioned at a substantially same height as the upper surfaces of the semiconductor laser elements 30, a thickness of the relay member 70 in a height direction can be made small and member cost can be reduced.

Each of the semiconductor laser elements 30 is arranged in m-row×n-column ($m \geq 2$, $n \geq 1$) in correspondence with each lens section. In this case, preferably, the number of the semiconductor laser elements 30 in the row direction is larger than the number of the semiconductor laser elements 30 in the column direction. In addition each of the semiconductor laser elements 30 is preferably disposed such that a distribution of light from the plurality of semiconductor laser elements 30 (light as the light-emitting device 1) forms a square. Accordingly, when the light-emitting device 1 is used as a part of a projector, a distribution of light intensity can be more easily made uniform.

Mirror 50

As shown in FIGS. 4A to 4D, the light-emitting device 1 may include, on the substrate 10, a mirror 50 that reflects emission light of the semiconductor laser element 30 toward the lens section 22. The mirror 50 is arranged so that a light-emitting surface (a surface that emits a laser beam: hereinafter, the same description will apply) of the semiconductor laser element 30 and the mirror 50 are opposed to each other. Accordingly, a travel distance of a laser beam from the light-emitting surface of the semiconductor laser element 30 to the light-emitting surface of the lens section 22 (hereinafter, referred to as an "optical path length") can be increased. Thus, optical density on the light-emitting surface of the lens array 20 can be reduced and optical dust collection on the surface of the lens sections 22 can be suppressed more easily. In addition, by increasing the optical path length, a change in an intensity distribution of light emitted from the lens sections 22 can be reduced as compared to cases where the optical path length is shorter (for example, a case where the mirror is not arranged and light is directly irradiated from the semiconductor laser element to the lens section). This is because, by increasing the optical path length, even if light from the semiconductor laser elements 30 is incident to the light incident surfaces of the lens sections 22 in a direction other than perpendicular due to a displacement of the semiconductor laser elements 30, an inclination of the light after passing the lens sections 22 can be reduced.

The number, a shape, and the like of the mirror 50 are not particularly limited. For example, a plurality of mirrors that are elongated in the row direction (the X direction in FIG. 4A) may be arranged in a plurality in the column direction or a plurality of mirrors 50 may be arranged in a pattern of a matrix of m-rows×n-columns (m≥2, n≥1) in correspondence with the plurality of lens sections 22. When arranging the mirrors 50 in a matrix pattern, since one mirror 50 is provided corresponding to each of the plurality of lens sections 22, even if a deviation occurs in a positional relationship between a given semiconductor laser element 30 and a given mirror 50, positional relationships between the other semiconductor laser elements 30 and the other mirrors 50 are not affected by the deviation. Therefore, an influence due to deviation in mounting of one mirror 50 can be minimized.

Glass, synthetic quartz, sapphire, aluminum, or the like can be used for the mirror 50. The mirror 50 has a reflecting surface that reflects emission light of the semiconductor laser element 30 (a laser beam emitted from the semiconductor laser elements 30: hereinafter, the same description will apply). For example, a reflective film such as a dielectric multilayer film is provided on the reflecting surface. When causing each emission light of the plurality of semiconductor laser elements 30 to be incident as-is to the lens array 20 without using the mirror 50, for example, the plurality of semiconductor laser elements 30 are arranged instead of mirrors 50 on the substrate 10 in a pattern of a matrix of m-row×n-columns (m≥2, n≥1).

Although not particularly limited, preferably, the mirror 50 is positioned directly below the vertex of the lens section 22. Particularly preferably, a reflecting part of the mirror 50 is positioned directly below the vertex of the lens section 22. Accordingly, since emission light of the semiconductor laser element 30 can be reflected by the mirror 50 toward the vertex of the lens section 22, an intensity distribution of light emitted from the lens array 20 (the lens sections 22) is less susceptible to change. In this case, a reflecting part refers to a portion that reflects emission light of the semiconductor laser element 30 in the reflecting surface of the mirror 50.

As shown in FIGS. 1A to 1D (for example, refer to the semiconductor laser element 30 and the mirror 50 transparently shown in the lens section 22 at a top left position in FIG. 1A), preferably, the semiconductor laser element 30 and the mirror 50 are arranged on an inner side of outer edge of the lens section 22 in a plan view. Accordingly, since the semiconductor laser element 30 is arranged near the mirror 50, an increase in an area of light emitted from the lens section 22 can be suppressed.

Sealing Member 80

As shown in FIGS. 1A to 1D, the light-emitting device 1 may include a sealing member 80 between the substrate 10 and the lens array 20. Providing the sealing member 80 enables a hermetic sealing effect to be increased as compared to a case where only the lens array 20 is provided. In particular, when using nitride semiconductor as the semiconductor laser element 30, since organic material or the like is likely to collect on the emitting surface of the semiconductor laser element 30, a hermetic sealing effect by the sealing member 80 becomes more prominent.

Figure 5A:
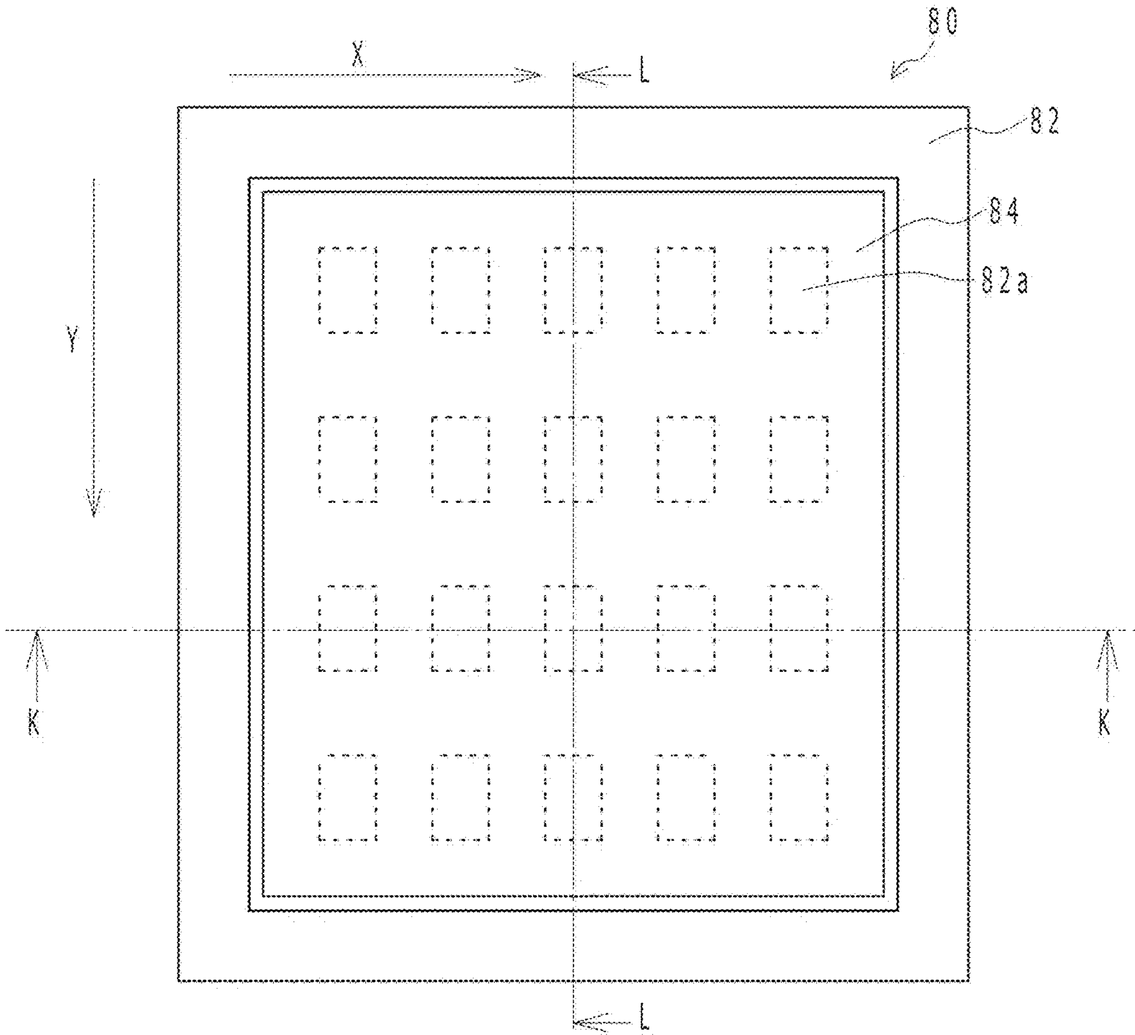
FIG. 5A is a schematic plan view of a sealing member.
Figure 5B:
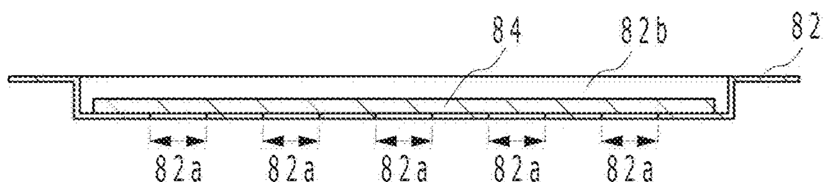
FIG. 5B is a sectional view taken along K-K in FIG. 5A.
Figure 5C:
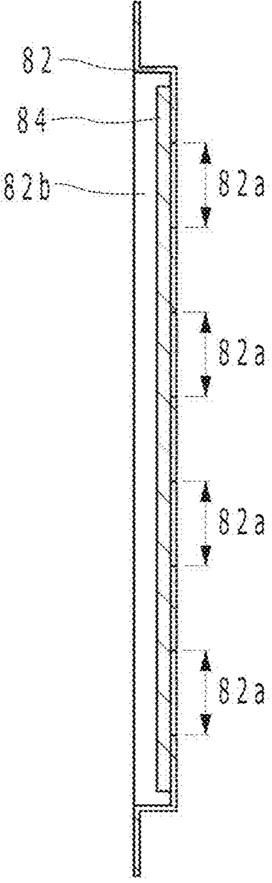
FIG. 5C is a sectional view taken along L-L in FIG. 5A.

FIG. 5A is a schematic plan view of the sealing member. In addition, FIG. 5B is a sectional view taken along K-K in FIG. 5A and FIG. 5C is a sectional view taken along L-L in FIG. 5A. In FIG. 5A, window parts 82*a* are transparently shown using dashed lines in order to facilitate understanding. As shown in FIGS. 5A to 5C, the sealing member 80 includes a body part 82 having a plurality of window parts 82*a* and a transmissive member 84. As the body part 82, glass, metal, ceramics, or a material combining these materials can be used and, metal can be preferably used. Accordingly, since the substrate 10 and the sealing member 80 can be fixed to each other by welding or the like, hermetic sealing can be more easily achieved. Furthermore, as the transmissive member 84, a member that allows transmission of at least emission light of the semiconductor laser elements 30 can be used. Shapes of the body part 82 and the transmissive member 84 are not particularly limited. For example, while the body part 82 includes a recess 82*b* on a side of the lens array 20 in the present embodiment, when using a flat plate-shape member as the substrate 10, the recess 82*b* may be provided on the side of the substrate 10.

While the body part 82 may include one window section 82*a* corresponding to two or more semiconductor laser elements 30, preferably, the body part 82 respectively includes one window section 82*a* corresponding to one semiconductor laser element 30. Accordingly, since a bonding area between the body part 82 and the transmissive member 84 excluding the window parts 82*a* can be increased, cracking of the transmissive member 84 due to stress can be suppressed when bonding the substrate 10 and the body part 82 to each other by resistance welding or the like to achieve a hermetic seal.

As described above, with the light-emitting device 1 according to the first embodiment, the plurality of lens sections 22 have a same curvature in the row direction (the X direction in FIG. 1A) and in the column direction (the Y direction in FIG. 1A). Therefore, a light-emitting device can be provided in which, even when the lens array 20 is mounted slightly rotated from a prescribed direction, a significant deviation is less likely to occur in a positional relationship between a light source and the lens section 22 and intensity distribution of light emitted from the lens array 20 is less susceptible to change.

Light-Emitting Device 2 According to Second Embodiment

Figure 6A:
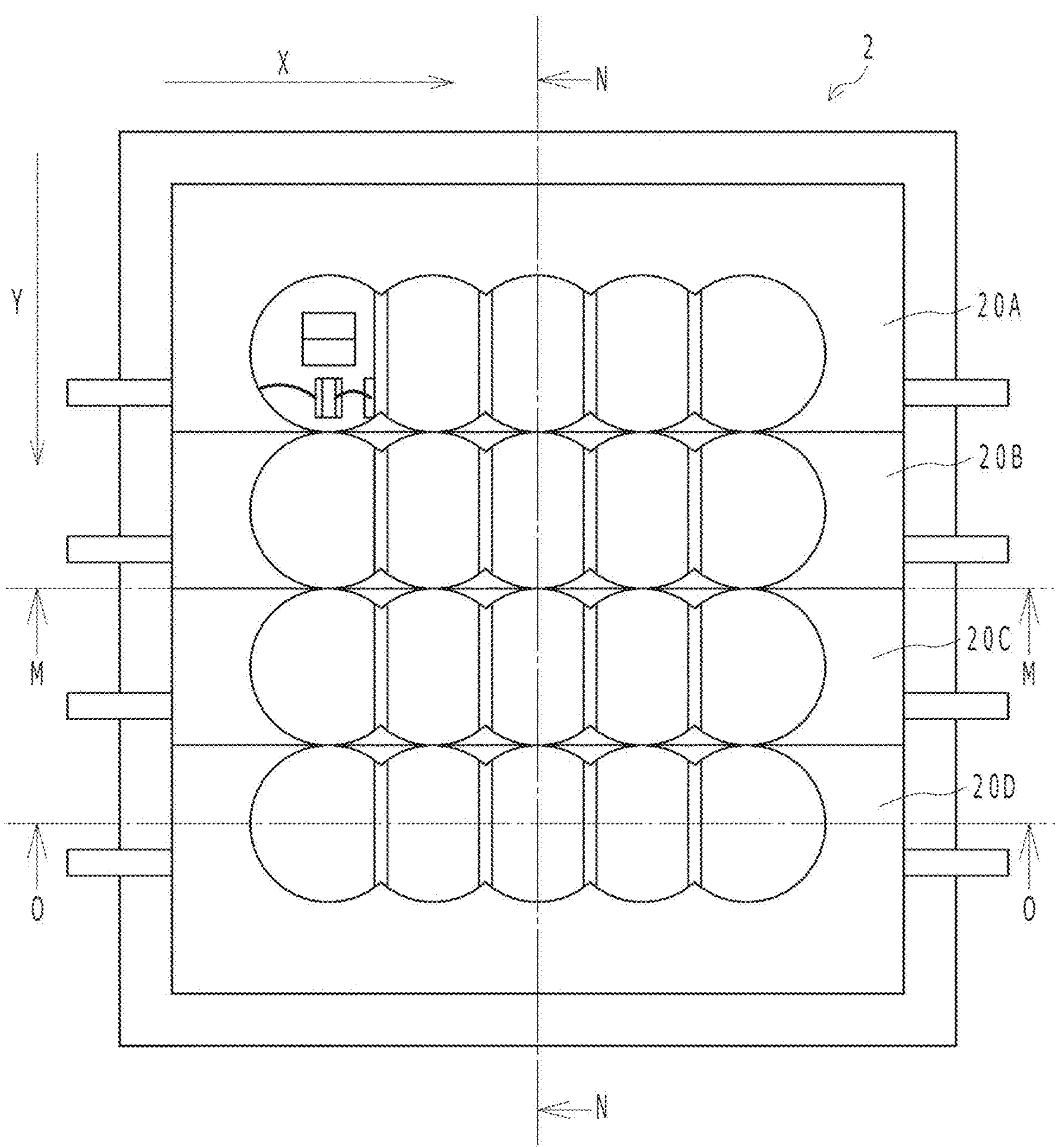
FIG. 6A is a schematic plan view of a light-emitting device according to a second embodiment.
Figure 6B:
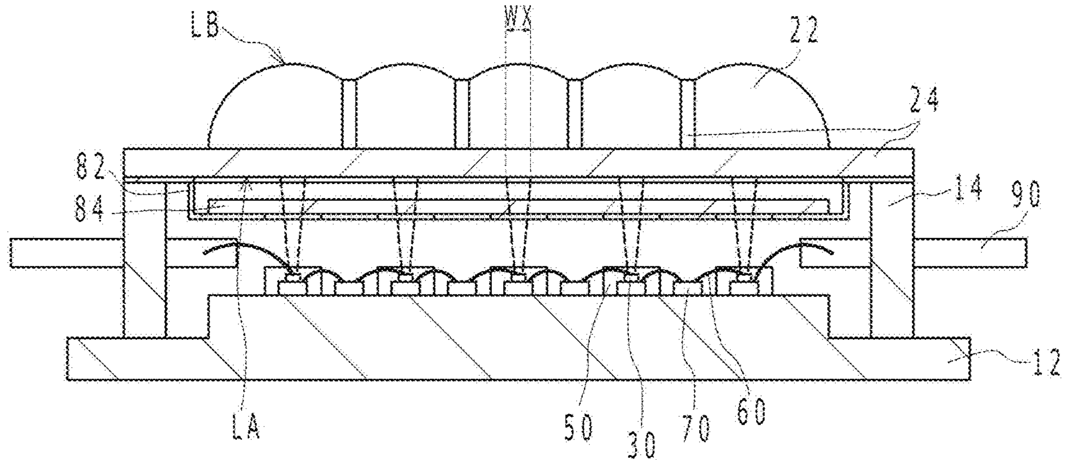
FIG. 6B is a sectional view taken along M-M in FIG. 6A.
Figure 6C:
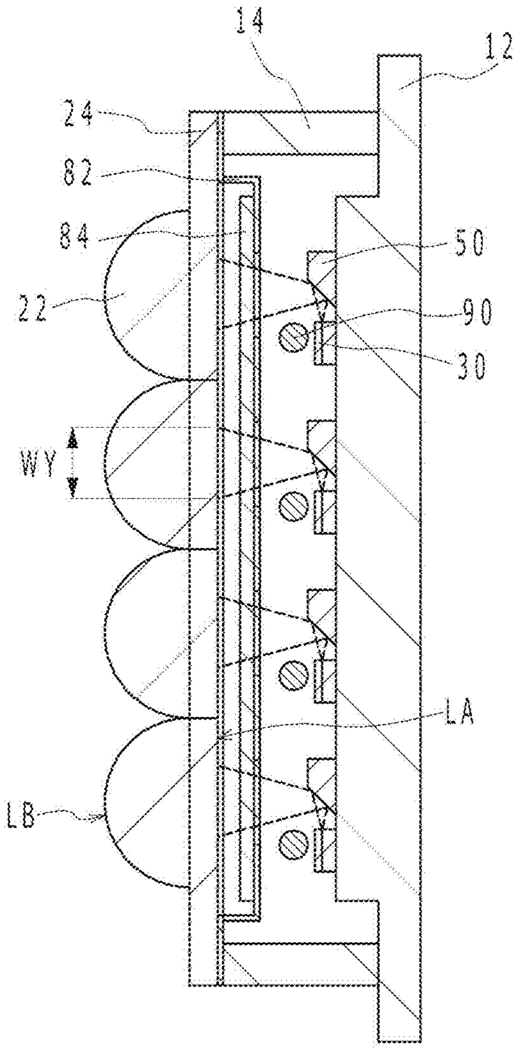
FIG. 6C is a sectional view taken along N-N in FIG. 6A.
Figure 6D:
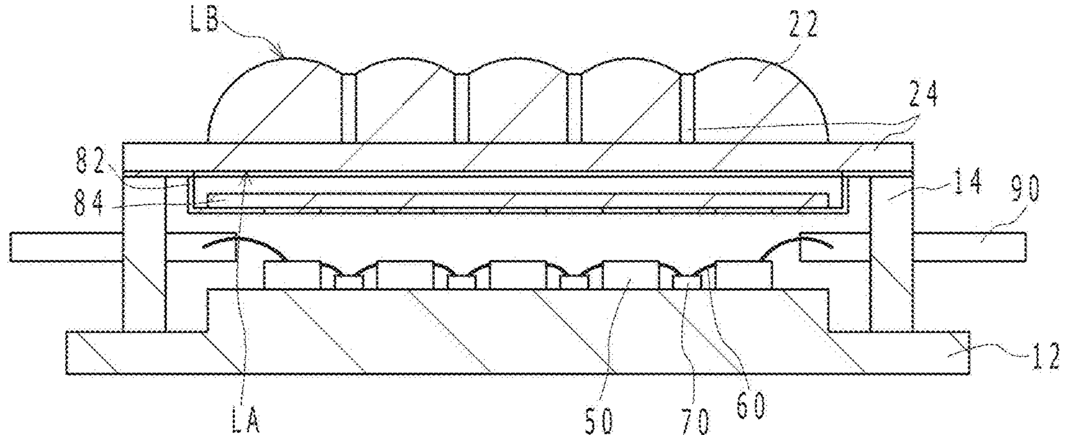
FIG. 6D is a sectional view taken along O-O in FIG. 6A.

FIG. 6A is a schematic plan view of a light-emitting device according to the second embodiment, FIG. 6B is a sectional view taken along M-M in FIG. 6A, FIG. 6C is a sectional view taken along N-N in FIG. 6A, and FIG. 6D is a sectional view taken along O-O in FIG. 6A. In FIG. 6A, the semiconductor laser element 30 and the like that are arranged below a top left lens section are transparently shown in order to facilitate understanding. As shown in FIGS. 6A to 6D, a light-emitting device 2 according to the second embodiment differs from the light-emitting device 1 according to the first embodiment in that a plurality of lens arrays 20A, 20B, 20C, and 20D are arranged in the column direction (the Y direction in FIG. 6A), and each of the plurality of lens arrays 20A, 20B, 20C, and 20D have a plurality of lens sections 22 in the row direction (the X direction in FIG. 6A). With the second embodiment, in a similar manner to the first embodiment, a light-emitting device can be provided in which, even when the lens array 20 is mounted slightly rotated from a prescribed direction, a significant deviation is less likely to occur in a positional relationship between a light source and the lens section 22 and intensity distribution of light emitted from the lens array 20 is less susceptible to change.

Light-Emitting Device 3 According to Third Embodiment

Figure 7:
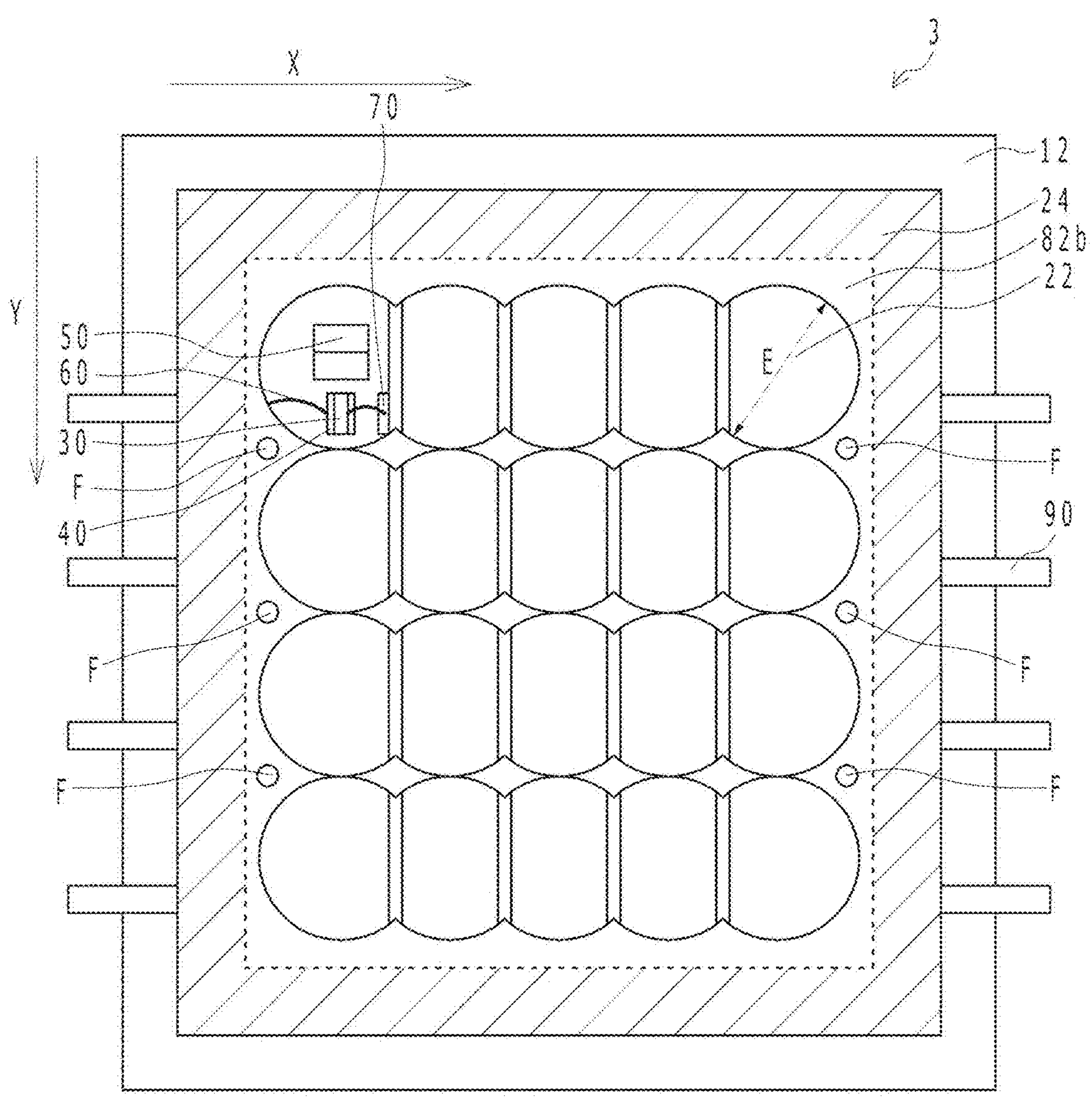
FIG. 7 is a schematic plan view of a light-emitting device according to a third embodiment.

FIG. 7 is a schematic plan view of a light-emitting device 3 according to the third embodiment. In FIG. 7, an outer edge of the recess 82*b* is indicated by a dashed line. In addition, in FIG. 7, hatchings are applied to a region in which the lens array 20 is fixed to the sealing member 80 by an adhesive. As shown in FIG. 7, in the light-emitting device 3, the lens array 20 includes a connecting part 24 that connects lens sections 22 with each other and is fixed to the sealing member 80 at the connecting part 24 by the adhesive. The sealing member 80 includes the recess 82*b*, which is recessed toward a region where a plurality of semiconductor laser elements 30 are mounted on the substrate 10. In a plan view, the lens array 20 includes a through-hole F at an inner side of the recess 82*b* and is fixed to the sealing member 80 by the adhesive at an outer side of the recess 82*b*.

When a space between the lens array and the sealing member is a sealed space, in a case where the lens array is fixed by an adhesive (for example, a UV curable adhesive) containing organic material, gas vaporized from the adhesive pools in the space between the lens array and the sealing member. In this case, the organic material contained in the vaporized gas may react to laser beam and may collect on the transmissive member or the lower surface of the lens array. In contrast, since the space between the lens array 20 and the sealing member 80 becomes an open space by providing the through-hole F in the connecting part 24, gas vaporized from the adhesive is released to the outside of the space and collection of organic material (optical dust collection) can be more easily suppressed. The open space refers to a space that is open to an area outside the light-emitting device.

Preferably, a plurality of through-holes F are provided. In addition the plurality of through-holes F are preferably provided so as to be symmetrical with respect to a center line of the lens array 20. Accordingly, since a flow of air can be more easily formed in the space between the lens array 20 and the sealing member 80 (for example, when two through-holes are line-symmetrically provided, an air flow involving air flowing into the space via one of the through-holes and air flowing out from the space via the other through-hole is more easily formed), gas vaporized from the adhesive is further released to the outside of the space and collection of organic material (optical dust collection) in the space can be further easily suppressed. In addition, an occurrence of dew condensation in the space between the lens array 20 and the sealing member 80 can also be suppressed. Since an adhesive containing organic material such as a UV curable adhesive is a material that tends to absorb moisture, when the lens array 20 is fixed by a UV curable adhesive, moisture absorbed by the adhesive from the atmosphere is likely to pool in the space between the sealing member 80 and the lens array 20 and, depending on usage, dew condensation may occur in the space. Therefore, the configuration described above in which a flow of air is formed in the space can be particularly preferably applied to a case where the lens array 20 is fixed to the sealing member 80 by an adhesive containing organic material such as a UV curable adhesive.

Light-Emitting Device 4 According to Fourth Embodiment

Figure 8:
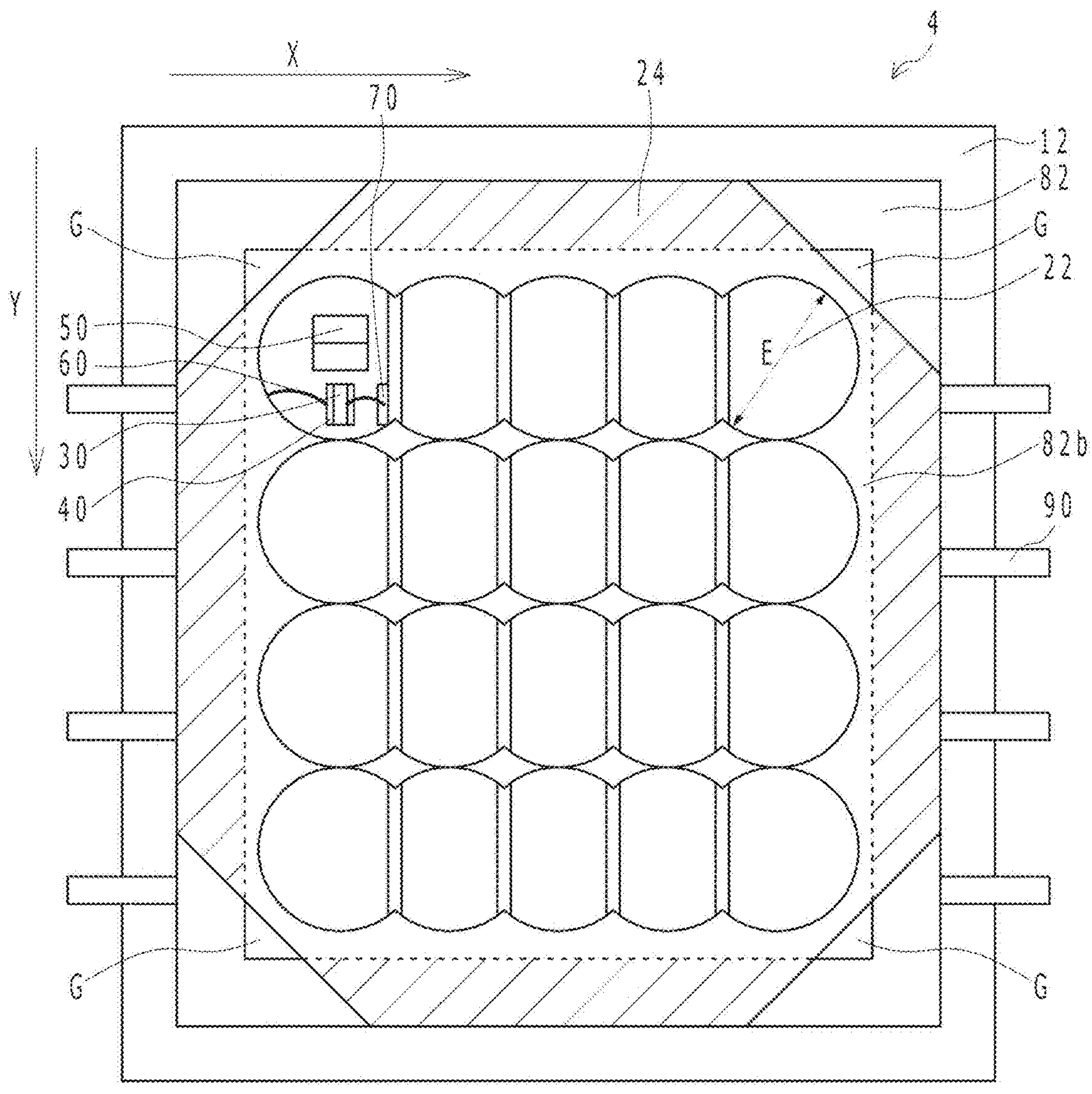
FIG. 8 is a schematic plan view of a light-emitting device according to a fourth embodiment.

FIG. 8 is a schematic plan view of a light-emitting device 4 according to a fourth embodiment. In FIG. 8, an outer edge of the recess 82*b* is indicated by a solid line and a dashed line. In addition, in FIG. 8, hatchings are applied to a region in which the lens array 20 is fixed to the sealing member 80 by an adhesive. As shown in FIG. 8, in the light-emitting device 4, the sealing member 80 includes the recess 82*b*, which is recessed toward a region where a plurality of semiconductor laser elements 30 are mounted on the substrate 10. In a plan view, a part of an outer edge of the lens array 20 is arranged so as to be positioned at an inner side of the recess 82*b* (refer to an opening G in FIG. 8) and the lens array 20 is fixed to the sealing member 80 by an adhesive at an outer side of the recess 82*b*. Even with the light-emitting device 4, since the space between the lens array 20 and the sealing member 80 becomes an open space, collection of organic material (optical dust collection) and an occurrence of dew condensation can be more easily suppressed.

The number and an arrangement of the opening G need only enable a part of the outer edge of the lens array 20 to be positioned at the inner side of the recess 82*b* and are not limited to the number and the arrangement illustrated in FIG. 8. However, preferably, the opening G is provided at two or more locations (not limited to four corners) at the outer edge of the lens array 20. In addition, in this case, preferably, the openings G are provided so as to be symmetrical with respect to a center of the lens array 20. Accordingly, in a similar manner to a case where a plurality of through-holes F are provided so as to be symmetrical with respect to the center line of the lens array 20, a flow of air is more likely to be formed in the space between the lens array 20 and the sealing member 80. Therefore, collection of organic material (optical dust collection) and an occurrence of dew condensation can be even more easily suppressed.

While the third and fourth embodiments have been described above, the through-hole F and the opening G are examples of specific configurations for making the space between the lens array 20 and the sealing member 80 an open space. The space between the lens array 20 and the sealing member 80 need only be opened so that gas generated inside the space can be released to the outside and a specific configuration of such an open state is not particularly limited.

While embodiments have been described above, the description is not intended to limit in any way the invention described in the claims.

What is claimed is:

1. A light-emitting device comprising:

a base having an upper surface;

a plurality of semiconductor laser elements configured to emit light in a first direction in a top view, the plurality of semiconductor laser elements being arranged on the upper surface of the base in a second direction perpendicular to the first direction in a top view;

one or more reflecting members spaced from the plurality of semiconductor laser elements in the first direction in a top view; and a lens member having a plurality of lens sections through which light reflected by the one or more reflecting members passes, the lens member being fixed to the base and arranged in the second direction at positions above the plurality of semiconductor laser elements and the one or more reflecting members; wherein:

in a top view, at least a portion of a first of the one or more reflecting members and an emitting surface of a first of the plurality of semiconductor laser elements is disposed in a region inward of an outer edge of a first of the plurality of lens sections, in a top view, an emitting surface of each of the semiconductor laser elements is disposed in a region inward of an outer edge of a respective one of the plurality of lens sections, and the plurality of lens sections are arranged such that an inter-vertex distance between adjacent lens sections in the second direction is smaller than a maximum outer diameter of each of the lens sections.

2. The light-emitting device according to claim 1, wherein:

in a top view, the emitting surface of the first semiconductor laser element disposed in the region inward of the outer edge of the first lens section is positioned between (i) a first virtual line that extends parallel to the second direction and passes through one end of a width of light from the first semiconductor laser element in the first direction at a light incident surface of the lens member and (ii) a second virtual line that extends parallel to the second direction and passes through another end of the width of light from the first semiconductor laser element in the first direction at the light incident surface of the lens member.

3. The light-emitting device according to claim 2, wherein:

in a top view, the width of light from the first semiconductor laser element in the first direction at the light incident surface of the lens member is less than a width of the first lens section in the first direction; and in a top view, a width of light from the first semiconductor laser element in the second direction at the light incident surface of the lens member is less than a width of the first lens section in the second direction.

4. The light-emitting device according to claim 1, wherein:

in a top view, a width in the first direction of the first reflecting member is less than a width in the first direction of the first lens section; and in a top view, a width in the first direction of the first semiconductor laser element is less than the width in the first direction of the first lens section.

5. The light-emitting device according to claim 1, wherein:

the one or more reflecting members comprises a plurality of reflecting members arranged on the upper surface of the base in the second direction in a top view; and a distance between adjacent semiconductor laser elements is larger than a distance between adjacent reflecting members.

6. The light-emitting device according to claim 1, further comprising:

a plurality of wirings electrically connected to the one or more semiconductor elements; wherein:

the plurality of wirings includes a first wiring joined to the first semiconductor laser element; and in a top view, a first portion of the first wiring is disposed within the region inward of the outer edge of the first lens section and a second portion of the first wiring is located outward of the outer edge of the first lens section.

7. The light-emitting device according to claim 1, further comprising:

one or more mounting bodies on which the one or more semiconductor elements are disposed.

8. The light-emitting device according to claim 1, wherein:

the plurality of lens sections comprise five or more lens sections arranged in the second direction.

9. The light-emitting device according to claim 1, further comprising:

a sealing member being fixed to the base; wherein:

the lens member is fixed to the base via the sealing member;

the plurality of semiconductor laser elements are disposed in a sealed space; and the lens member is located outside the sealed space.

10. The light-emitting device according to claim 1, wherein:

in the lens member, a maximum outer diameter of each lens section is 1.25 times or more than an inter-vertex distance between adjacent ones of the lens sections in the second direction.

11. The light-emitting device according to claim 1, wherein:

the plurality of lens sections includes a second lens section, and two or more third lens sections arranged between the first lens section and the second lens section, and a shape of at least one of the third lens sections is different from a shape of the first lens section.

12. The light-emitting device according to claim 11, wherein:

a shape of each third lens section is different from a shape of the second lens section.

13. The light-emitting device according to claim 11, wherein:

each of the two or more third lens sections has the same shape.

14. The light-emitting device according to claim 1, further comprising:

a sealing member located above the base; wherein the lens member is fixed to the sealing member by adhesive;

the plurality of semiconductor laser elements are disposed in a sealed space;

the lens member is located outside the sealed space; and a space between the sealing member and the lens member is open to an area outside the light-emitting device via at least one gap in the adhesive between the sealing member and the lens member.

15. The light-emitting device according to claim 14, wherein:

at an outer edge of the lens member, the adhesive is respectively disposed at two or more areas that are separated from each other.

* * * * *